(12) United States Patent
Long

(10) Patent No.: US 10,263,018 B2
(45) Date of Patent: Apr. 16, 2019

(54) SIGNAL LINE STRUCTURE, ARRAY SUBSTRATE, AND DISPLAY DEVICE

(71) Applicant: BOE Technology Group Co., Ltd., Beijing (CN)

(72) Inventor: Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/718,973

(22) Filed: Sep. 28, 2017

(65) Prior Publication Data
US 2018/0211976 A1 Jul. 26, 2018

(30) Foreign Application Priority Data
Jan. 20, 2017 (CN) .................... 2017 2 0083092 U

(51) Int. Cl.
*H01L 23/64* (2006.01)
*H01L 27/12* (2006.01)

(52) U.S. Cl.
CPC ............ *H01L 27/124* (2013.01); *H01L 23/64* (2013.01)

(58) Field of Classification Search
CPC .............................. H01L 23/64; H01L 27/124
USPC .......................................................... 257/773
See application file for complete search history.

(56) References Cited

U.S. PATENT DOCUMENTS 7,427,540 B2 * 9/2008 Liao ...................... H01L 27/124
438/151
9,470,943 B2 * 10/2016 Tang .................. G02F 1/136259

* cited by examiner

*Primary Examiner* — Luan C Thai
(74) *Attorney, Agent, or Firm* — McAndrews, Held & Malloy, Ltd.

(57) ABSTRACT

Embodiments of the disclosure relate to a signal line structure, an array substrate, and a display device, where the signal line structure includes a plurality of signal lines arranged adjacent to each other at the same layer; and at least one redundant wire at a different layer from the signal lines, wherein each redundant wire corresponds to two adjacent signal lines, and a positive projection of the each redundant wire onto the layer where the signal lines are located covers a part or all of a gap between the two adjacent signal lines corresponding to the each redundant wire.

17 Claims, 6 Drawing Sheets

SIGNAL LINE STRUCTURE, ARRAY SUBSTRATE, AND DISPLAY DEVICE

CROSS-REFERENCES TO RELATED APPLICATIONS

This application claims priority to Chinese patent application No. 201720083092.3 filed on Jan. 20, 2017, which is incorporated herein by reference in its entirety.

FIELD

The present disclosure relates to the field of liquid crystal displays, and particularly to a signal line structure, an array substrate, and a display device.

BACKGROUND

An existing liquid crystal display, organic light-emitting diode display, or another flat panel display generally includes an array substrate for controlling the transmittivity or light emission strength of each pixel. The array substrate includes a plurality of gate lines and data lines intersecting with each other to define pixel zones, thin film transistors formed in the respective pixel areas, and electrically connected with the gate lines and the data lines, and pixel electrodes electrically connected with the thin film transistors and each pixel of the display typically includes a thin film transistor for applying a signal to the pixel electrode structure in the pixel of the display. Signals on the data lines and the gate lines are provided by a driver chip typically installed on a printed circuit board, where the signals of the driver chip are typically directed onto the gate lines and the data lines through metal leads in peripheral circuits of the array substrate, and the numbers of data lines and gate lines are increasing with the growing definition of the display, for example, there are more than 2,000 gate lines and 12,000 data lines on the existing 4K TV panel, and as a result, there are also increasing numbers of leads for gate lines and data lines.

Due to such a parasitic capacitance between adjacent signal lines that tends to distort a data signal being displayed, thus resulting in a trail, an afterimage, a flicker, and other display defects, a display image being displayed tends to be distorted due to the parasitic capacitance between the signal lines populated on the array substrate and in the peripheral circuits thereof in the prior art, including the gate lines, the data lines, common electrode lines, power source lines, control signal lines, clock signal lines, and the leads connecting them with each other.

In summary, there are such a large number of signal lines on the array substrate and in the peripheral circuits thereof in the prior art that the image being displayed may be distorted due to a crosstalk arising from the parasitic capacitance between the signal lines.

SUMMARY

An embodiment of the disclosure provides a signal line structure, which includes: a plurality of signal lines arranged adjacent to each other at a same layer; and at least one redundant wire at a different layer from the signal lines, wherein each redundant wire corresponds to two adjacent signal lines, and a positive projection of each redundant wire onto a layer where the signal lines are located covers a part or all of a gap between the two adjacent signal lines corresponding to the each redundant wire.

An embodiment of the disclosure provides an array substrate including the signal line structure according to the embodiments above of the disclosure.

An embodiment of the disclosure provides a display device including the array substrate according to the embodiment above of the disclosure.

BRIEF DESCRIPTION OF THE DRAWINGS

In order to make the technical solutions in the embodiments of the disclosure more apparent, the drawings to be used in a description of the embodiments will be briefly introduced below, and apparently the drawings to be described below are merely illustrative of some embodiments of the disclosure, and those ordinarily skilled in the art can derive from these drawings other drawings without any inventive effort. In the drawings.

DETAILED DESCRIPTION

In order to make the objects, the technical solutions, and the advantages of the disclosure more apparent, the disclosure will be further described in details with reference to the drawings. Apparently the described embodiments are only a part but all of the embodiments of the disclosure. Based upon the embodiments here of the disclosure, all of other embodiments derived by those ordinarily skilled in the art without any inventive effort shall come into the scope of the disclosure.

Embodiments of the present disclosure provide a signal line structure, an array substrate, and a display device so as to address the problem that there are such a large number of signal lines on the array substrate and in the peripheral circuits thereof that the image being displayed may be distorted due to a crosstalk arising from the parasitic capacitance between the signal lines.

Figure 1:
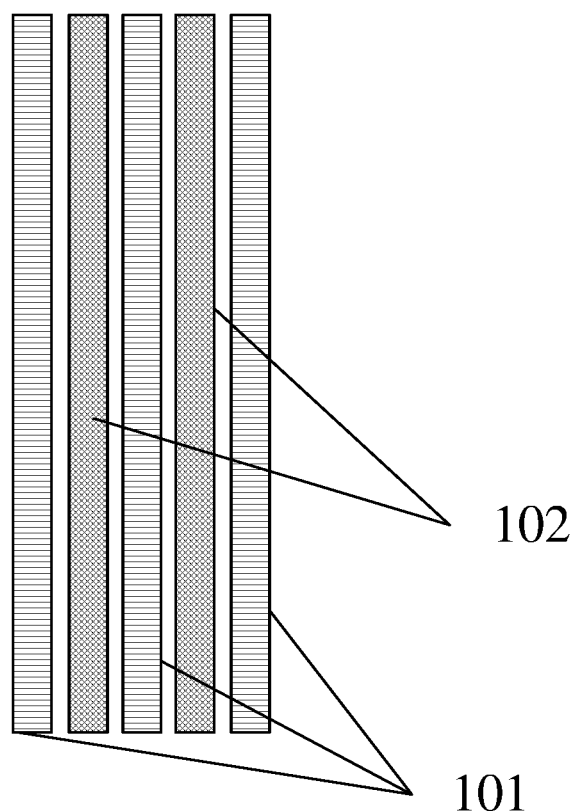
FIG. 1 is a schematic structural diagram of a signal line structure in accordance with an embodiment of the disclosure in a top view.

FIG. 1 is a schematic structural diagram of a signal line structure in accordance with an embodiment of the disclosure in a top view, and the signal line structure in accordance with the embodiment of the disclosure includes a plurality of signal lines 101 arranged adjacent to each other at the same layer, and also includes: at least one redundant wire 102 at a different layer from the signal lines 101, where each redundant wire 102 corresponds to two adjacent signal lines 101, and a positive projection of each redundant wire 102 onto the layer where the signal lines 101 are located covers a part or all of a gap between the two adjacent signal lines 101 corresponding to each redundant wire 102.

The signal lines in the embodiment of the disclosure can be gate lines, data lines, common electrode lines, power source lines, control signal lines, or clock signal lines in a display area of an array substrate, or can be leads in a non-display area of the array substrate, and/or in peripheral circuits of the array substrate, e.g., leads connecting the gate lines, the data lines, the common electrode lines, the power source lines, the control signal lines, or the clock signal lines.

Figure 2:
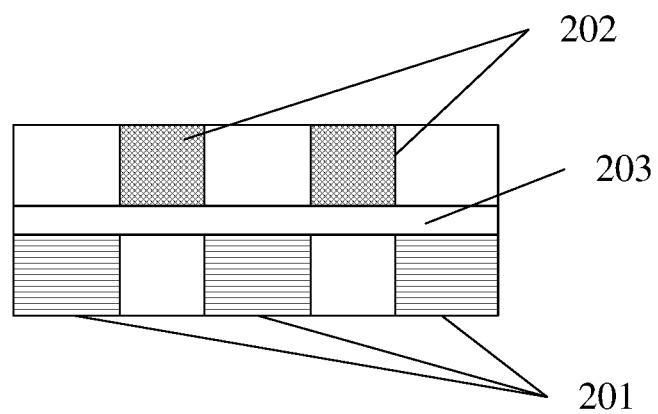
FIG. 2 is a schematic structural diagram of a signal line structure in accordance with an embodiment of the disclosure in a side view.

FIG. 2 is a schematic structural diagram of a signal line structure in accordance with an embodiment of the disclosure in a side view, where a redundant wire 202 is at a different layer from signal lines 201. In an implementation of the disclosure, the redundant wire 202 can be arranged at a layer immediately above the layer where the signal lines 201 are located, or the redundant wire 202 can be arranged at a layer immediately below the layer where the signal lines 201 are located.

The signal line structure in accordance with the embodiment of the disclosure can be applicable to a liquid crystal display and/or an organic light-emitting diode display, and other flat panel display devices. Since the positive projection of the redundant wire onto the layer where the signal lines are located covers a part or all of the gap between the two adjacent signal lines, the distance between the redundant wire and either of the signal lines corresponding thereto is shorter than the distance between the two adjacent signal lines corresponding to the redundant wire, so that a part of power lines originating from the signal lines can terminate at the redundant wire instead of the adjacent signal lines, thus reducing the number of power lines between the two adjacent signal lines, and lowering a parasitic capacitance between the two adjacent signal lines, to thereby alleviate a crosstalk arising from the parasitic capacitance between the two adjacent signal lines. Accordingly the signal line structure according to the embodiment of the disclosure can alleviate a risk of a displayed image being distortion due to the parasitic capacitance between the signal lines so as to improve the stability of the displayed image.

Optionally the signal lines are made of a metal material layer with the same or similar thickness as or to the redundant wire.

In the embodiment of the disclosure, the signal lines and the redundant wire can be made at different metal layers with the same or similar thickness to facilitate planarization of the surface of the signal line structure according to the embodiment of the disclosure, and to alleviate other wires, which are to be made above the signal line structure according to the embodiment of the disclosure, from being easily broken or covered non-uniformly.

Optionally there are a plurality of redundant wires at a different layer from the signal lines, and all the redundant wires are arranged at the same layer.

In the embodiment of the disclosure, the plurality of redundant wires at a different layer from the signal lines can be arranged at the same layer to thereby facilitate planarization of the surface of the signal line structure. For example, a plurality of redundant wires can be arranged at another line layer than the layer where the plurality of signal lines are located, where each redundant wire corresponds to two adjacent signal lines.

Optionally when the signal lines are gate lines or leads of the gate lines, the at least one redundant wire may be arranged at a data line metal layer.

When the signal lines are data lines or leads of the data lines, the at least one redundant wire may be arranged at a gate line metal layer.

In the embodiment of the disclosure, when the signal lines are gate lines or leads of the gate lines, the at least one redundant wire corresponding to the signal lines may be arranged at an adjacent data line metal layer; and when the signal lines are data lines or leads of the data lines, then the at least one redundant wire corresponding to the signal lines may be arranged at an adjacent gate line metal layer.

For example, when the signal lines 101 in the signal line structure illustrated in FIG. 1 are gate lines, then a data line metal layer may act as the layer where the redundant wire is located, and the redundant lines 102 may be arranged at this layer; and when the signal lines in the signal line structure illustrated in FIG. 1 are data lines, then a gate metal layer may act as the layer where the redundant wire is located, and the redundant lines 102 may be arranged at this layer.

Optionally the shape of the redundant wire is the same as or different from the shape of the gap between the two adjacent signal lines corresponding to the redundant wire.

Figure 3:
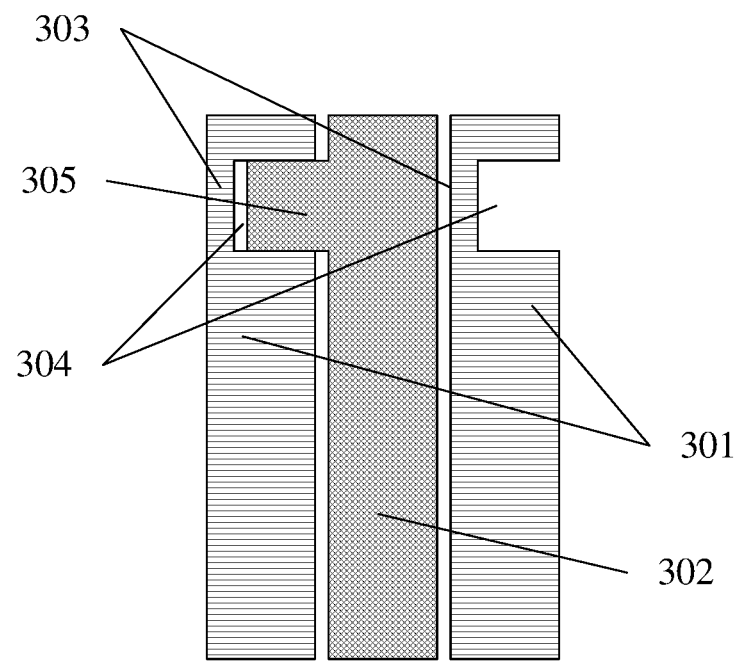
FIG. 3 is a schematic diagram of a signal line structure with a redundant wire bent section in accordance with an embodiment of the disclosure.

In some embodiments of the disclosure, the shape of the redundant wire is the same as or different from the shape of the gap between the two adjacent signal lines corresponding to the redundant wire, and as illustrated in FIG. 3, for example, the signal lines 301 include signal line bent sections 303 formed with recesses 304, and correspondingly the redundant wire 302 includes a redundant wire bent section 305 so that the shape of the redundant wire 302 is the same as the shape of the gap between the two adjacent signal lines corresponding thereto.

In some embodiments of the disclosure, the shape of the redundant wire may not be exactly the same as the shape of the gap between the two adjacent signal lines corresponding to the redundant wire without departing from the scope of the disclosure, as long as the positive projection of the redundant wire onto the layer where the signal lines are located can cover a part or all of the gap between the signal lines, and the crosstalk arising from the parasitic capacitance between the signal lines can be alleviated.

Optionally there are a plurality of redundant wires at a different layer from the signal lines, and the redundant wires are connected with the redundant wires adjacent thereto at the same layer through redundant connection lines.

In the embodiment of the disclosure, when there are a plurality of redundant wires at a different layer from the signal lines, these redundant wire at the same layer may be connected through redundant connection wires adjacent thereto to thereby alleviate an influence of the parasitic capacitance upon a transmitted signal.

Optionally the redundant connection lines are at the same layer as the redundant wires.

In the embodiment of the disclosure, the redundant connection lines may be arranged at the same layer as the redundant wires.

Optionally when the redundant connection lines are at a different layer from the redundant wires, then the redundant connection lines may be connected with the redundant wires through via-holes.

In the embodiment of the disclosure, the redundant connection lines may be arranged at a different layer from the redundant wires, and the redundant connection lines may be connected with the redundant wires through via-holes.

In the embodiment of the disclosure, the redundant wires can be connected with the other redundant wires over the redundant connection lines in a number of implementations:

In a first implementation, the redundant connection line is at the same layer as the redundant wires.

Figure 4:
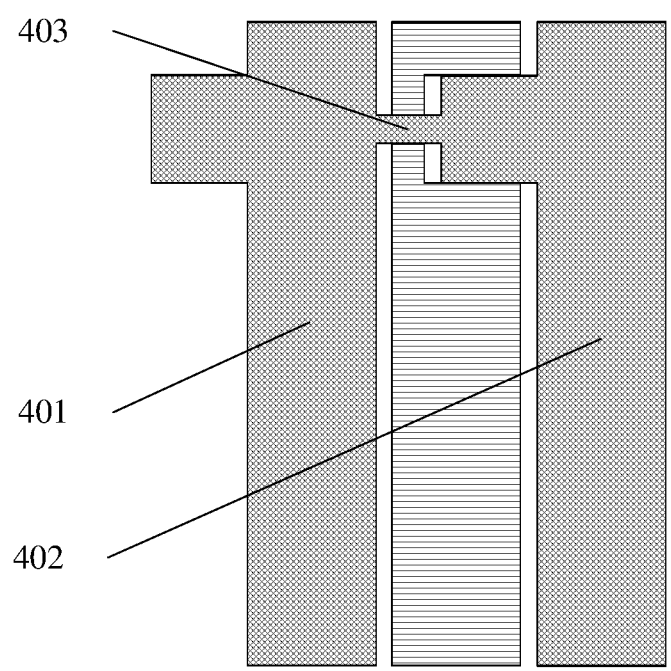
FIG. 4 is a schematic diagram of a signal line structure in which redundant wires are connected by a redundant connection line at the same layer as the redundant wire in accordance with an embodiment of the disclosure.

In an implementation of the embodiment of the disclosure in which the redundant wire is connected with another redundant wire through the redundant connection line, one or more redundant connection lines are arranged at the same layer as the redundant wires to connect two adjacent redundant wires. As illustrated in FIG. 4, for example, a redundant connection line 403 is arranged between a redundant wire 401 and a redundant wire 402 to connect the redundant wire 401 with the redundant wire 402.

In a second implementation, the redundant connection line is at a different layer from the redundant wires.

Figure 5:
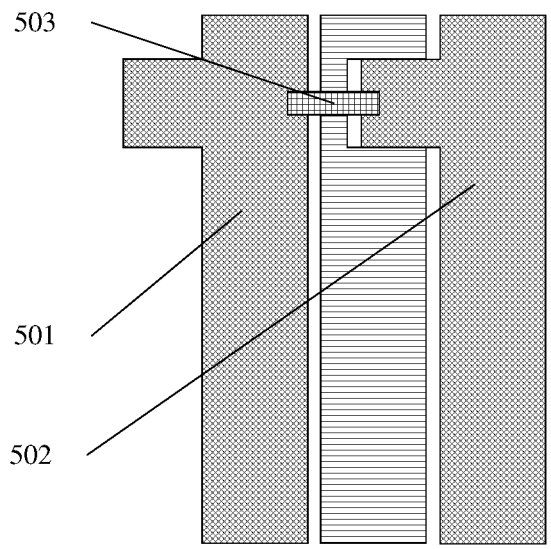
FIG. 5 is a schematic diagram of a signal line structure in which redundant wires are connected by a redundant connection line at a different layer from the redundant wire in accordance with an embodiment of the disclosure.

In another implementation of the embodiment of the disclosure in which the redundant wire is connected with another redundant wire through the redundant connection line, one or more redundant connection lines are arranged at a different layer from the redundant wires to connect two adjacent redundant wires through via-holes. As illustrated in FIG. 5, for example, a redundant connection line 503 is arranged at a different line layer from a redundant wire 501 and a redundant wire 502 to connect the redundant wire 501 with the redundant wire 502 through a via-hole 504.

Optionally all the redundant wires are floating, or grounded or connected with the same stable signal source through redundant wire input terminals.

In the embodiment of the disclosure, all the redundant wires can be set in a floating state, that is, each redundant wire is not connected with any other adjacent redundant wire, not connected with any signal line of the array substrate, and not connected with any signal line, lead or pad which is fanned out from a display chip. The redundant wires in a floating state can enable a part of power lines originating from the signal lines to terminate at the redundant wires to thereby alleviate the crosstalk from arising from the parasitic capacitance between the adjacent signal lines for the effect of stabilizing a transmitted signal.

In the embodiment of the disclosure, all the input terminals of the redundant wires can be further grounded or connected with the same stable signal source so that the power lines originating from the signal lines terminate at the redundant wires to thereby completely shield the crosstalk arising from the parasitic capacitance between the adjacent signal lines for the effect of stabilizing a transmitted signal.

In the embodiment of the disclosure, all the input terminals of the redundant wires can be grounded or connected with the same stable signal source in a number of implementations, two of which will be described below.

In a first implementation, the plurality of redundant wires are not connected with each other, and each redundant wire is grounded respectively or connected respectively with a stable signal source.

Figure 6:
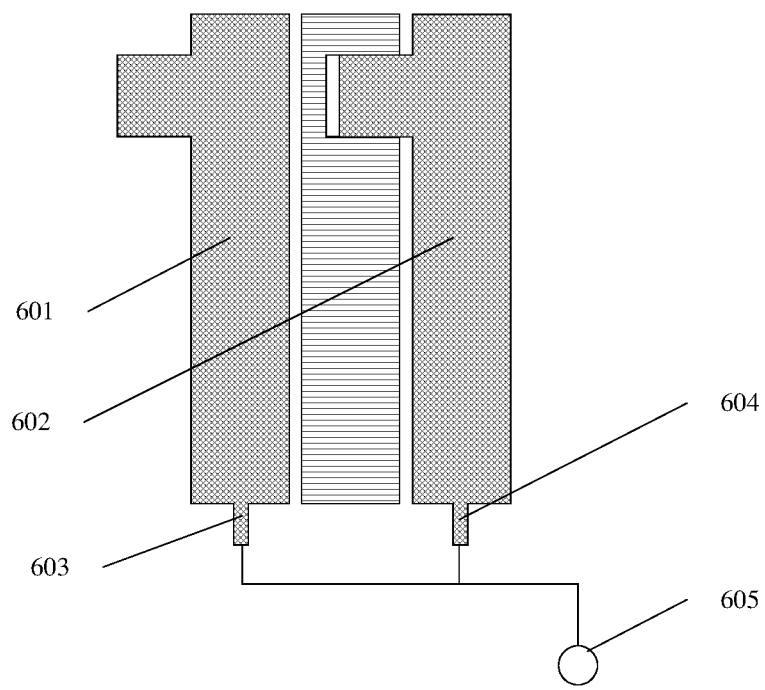
FIG. 6 is a schematic diagram of a signal line structure in which redundant wires are connected with a stable signal source respectively at redundant wire input terminals in accordance with an embodiment of the disclosure.

In an implementation of the embodiment of the disclosure in which the redundant wires are connected with the same stable signal source, each separate redundant wire is grounded respectively or connected respectively with a stable signal source to thereby shield the crosstalk between the signal lines. As illustrated in FIG. 6, for example, a redundant wire 601 and a redundant wire 602 are connected respectively with a stable signal source 605 through a redundant wire input terminal 603 and a redundant wire input terminal 604.

In a second implementation, the plurality of redundant wires are connected with each other, and grounded or connected with a stable signal source through a common redundant wire input terminal.

Figure 7:
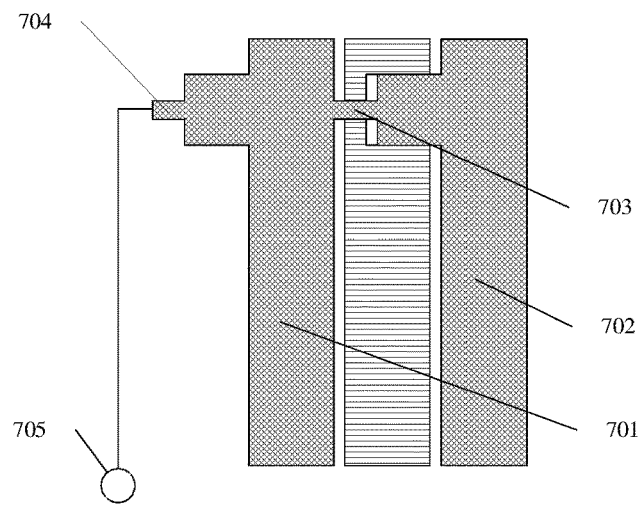
FIG. 7 is a schematic diagram of a signal line structure in which redundant wires are connected with a stable signal source at a common redundant wire input terminal in accordance with an embodiment of the disclosure.

In another implementation of the embodiment of the disclosure in which the redundant wires are connected with the same stable signal source, the redundant wires are connected with each other, and grounded or connected with a stable signal source at one or more redundant wire input terminals to thereby shield the crosstalk between the signal lines. As illustrated in FIG. 7, for example, a redundant wire 701 and a redundant wire 702 are connected by a redundant connection line 703, and connected with a stable signal source 705 through a redundant wire input terminal 702.

Optionally the stable signal source is a common voltage supply, or a stable signal in the array substrate.

The stable signal source in the embodiment of the disclosure can be a common voltage supply, or a stable signal in the array substrate. The redundant wires can be connected with the common stable signal source to thereby shield the adjacent signal lines from each other so as to eliminate the crosstalk arising from the parasitic capacitance between the adjacent signal lines. For example, the redundant wires are connected with the common voltage supply, or a stable DC voltage signal, e.g., a stable DC voltage signal of 200V, at the redundant wire input terminal.

Optionally the signal line structure further includes an insulation layer between the layer where the signal lines are located and the layer where the redundant wire is located.

In the embodiment of the disclosure, there is further the insulation layer between the layer where the signal lines are located and the layer where the redundant wire is located. As illustrated in FIG. 2, there is further an insulation layer 203 between the layer where the redundant wires 202 are located, and the layers where the signal lines 201 are located, to thereby prevent the redundant wire 202 from being connected with the signal lines 201, where the thickness of the insulation layer 203 shall be less than the distance between two adjacent signal lines, and the distance between the redundant wire and either of the signal lines corresponding thereto shall be shorter than the distance between the two adjacent signal lines corresponding to the redundant wire.

Optionally the insulation layer includes a part or all of a gate insulation layer, an interlayer insulation layer, a passivation layer, or a planarization layer.

The insulation layer in the embodiment of the disclosure can be a gate insulation layer, an interlayer insulation layer, a passivation layer, a planarization layer, or a combination of a part or all of them. For example, the insulation layer can alternatively be a gate insulation layer and a passivation layer, a gate insulation layer and an interlayer insulation layer, a gate insulation layer and a planarization layer, an interlayer insulation layer and a planarization layer, or a passivation layer and a planarization layer.

Optionally the signal lines include a part or all of gate lines, leads of the gate lines, data lines, leads of the data lines, common electrode lines, leads of the common electrode lines, power source lines, leads of the power source lines, control signal lines, leads of the control signal lines, clock signal lines, or leads of the clock signal lines.

The signal lines in the embodiment of the disclosure can be gate lines, data lines, common electrode lines, power source lines, control signal lines, clock signal lines, or leads of the signal lines above.

For example, the signal lines 101 in the signal line structure as illustrated in FIG. 1 can be gate lines, data lines, common electrode lines, power source lines, control signal lines, clock signal lines, or leads of the signal lines above.

Figure 8:
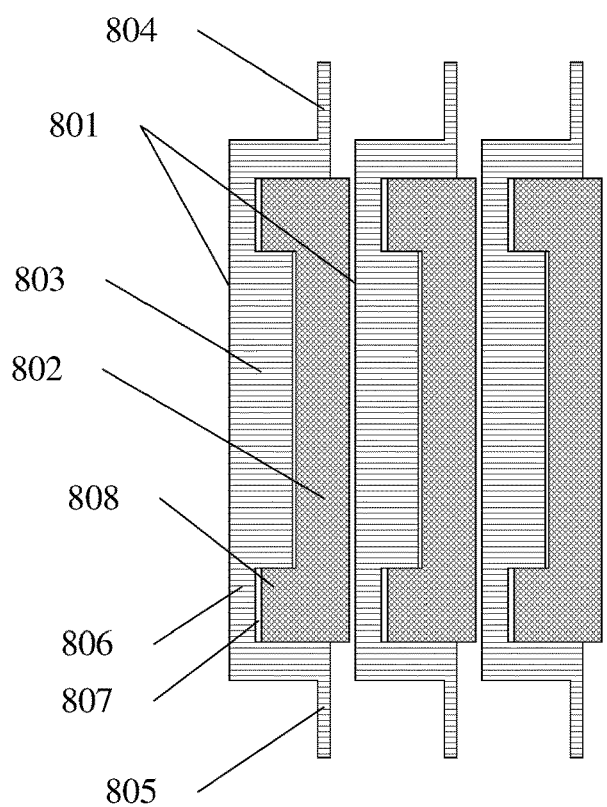
FIG. 8 is a first schematic diagram of a signal line structure in accordance with an embodiment of the disclosure.

As illustrated in FIG. 8, one signal line structure according to an embodiment of the disclosure includes: a plurality of signal lines 801 arranged adjacent to each other at the same layer, and redundant wires 802 each of which corresponds to two adjacent signal lines, where a positive projection of each redundant wire 802 onto the layer where the signal lines 801 are located covers a part or all of a gap between the two adjacent signal lines 801 corresponding to the each redundant wire 802.

In the signal line structure as illustrated in FIG. 8, the width of a signal line body 803 of each signal line 801 ranges from 1 to 50 micrometers; the distance between two adjacent signal lines ranges from 1 to 50 micrometers; the signal lines 801 can be connected with a driver chip, or engaged with pads on the driver chip, or connected with a transmission line or a transmission terminal providing a signal, through signal line input terminals 804; the signal lines 801 can be connected with a display area or a function area, e.g., a gate driver circuit, a test circuit, etc., in which signals on the signal lines are received, through signal line output terminals 805; the width of each of the signal line input terminals 804 and the signal line output terminals 805 range from 1 to 50 micrometers, and may be the same as the width of the signal line bodies 803; the signal lines 801 can include signal line bent sections 806, where the width of the signal line bent sections 806 range from 1 to 50 micrometers, and is less than the width of the signal line bodies 803; the signal line bent sections 806 are formed with recessions 807; and the bodies 803, the signal line input terminals 804, the signal line output terminals 805, and the signal line bent sections 806 of the signal lines 801 are formed in the same layer photolithograph process, and can be made of cooper (Cu), aluminum (Al), molybdenum (Mo), titanium (Ti), chrome (Cr), tungsten (W), neodymium (Nd), niobium (Nb) or another metal material, and/or an alloy of these metal materials.

In the signal line structure as illustrated in FIG. 8, the width of each of the redundant wires 802 ranges from 1 to 50 micrometers, where the redundant wires 802 are provided with redundant wire bent sections 808 corresponding to the signal line bent sections 806 so that the shape of the redundant wires 802 is the same as the shape as the gap between the signal lines 801; and the redundant wires 802 and the signal lines 801 are not formed in the same layer photolithograph process, and the redundant wires 802 and the signal lines 801 can be made of Cu, Al, Mo, Ti, Cr, W, Nd, Nb or another metal material, and/or an alloy of these metal materials.

In the signal line structure as illustrated in FIG. 8, the projection of each redundant wire 802 onto the layer where the signal lines 801 are located can completely cover the gap between two adjacent signal lines 801 in that the projection completely covers the gap between the signal lines 801 without overlapping with the signal lines 801 (that is, the projection of the redundant wire 802 onto the layer where the signal lines 801 are located overlaps with the signal lines 801 by a width of 0 micrometer), or the projection completely covers the gap between the signal lines 801 while overlapping with the signal lines 801 (for example, the projection of the redundant wire 802 onto the layer where the signal lines 801 are located overlaps with the signal lines 801 by a width of 0 micrometer, or more than 0 micrometer and less than 5 micrometers); or the projection of the redundant wire 802 onto the layer where the signal lines 801 are located can cover a part of the gap between the two adjacent signal lines 801 (for example, the distance between the projection of the redundant wire 802 onto the layer where the signal lines 801 are located, and the signal line 801 is more than 0 micrometer, and less than 5 micrometers).

In the signal line structure as illustrated in FIG. 8, the edges of the redundant wires 802 are substantially parallel to the edges of the signal lines 801, where the edges of the signal lines 801 and the redundant wires 802 will not be limited to the straight lines as illustrated in FIG. 8, but may be lines in any shape.

In the signal line structure as illustrated in FIG. 8, the plurality of redundant wires can be located at the same layer, and are not connected with each other, but each redundant wire is not connected with any signal line. The redundant wires in the signal line structure as illustrated in FIG. 8 are floating so that a part of power lines originating from the signal lines terminate at the redundant wires to thereby alleviate the crosstalk arising from the parasitic capacitance between the adjacent signal lines for the effect of stabilizing a transmitted signal.

Figure 9:
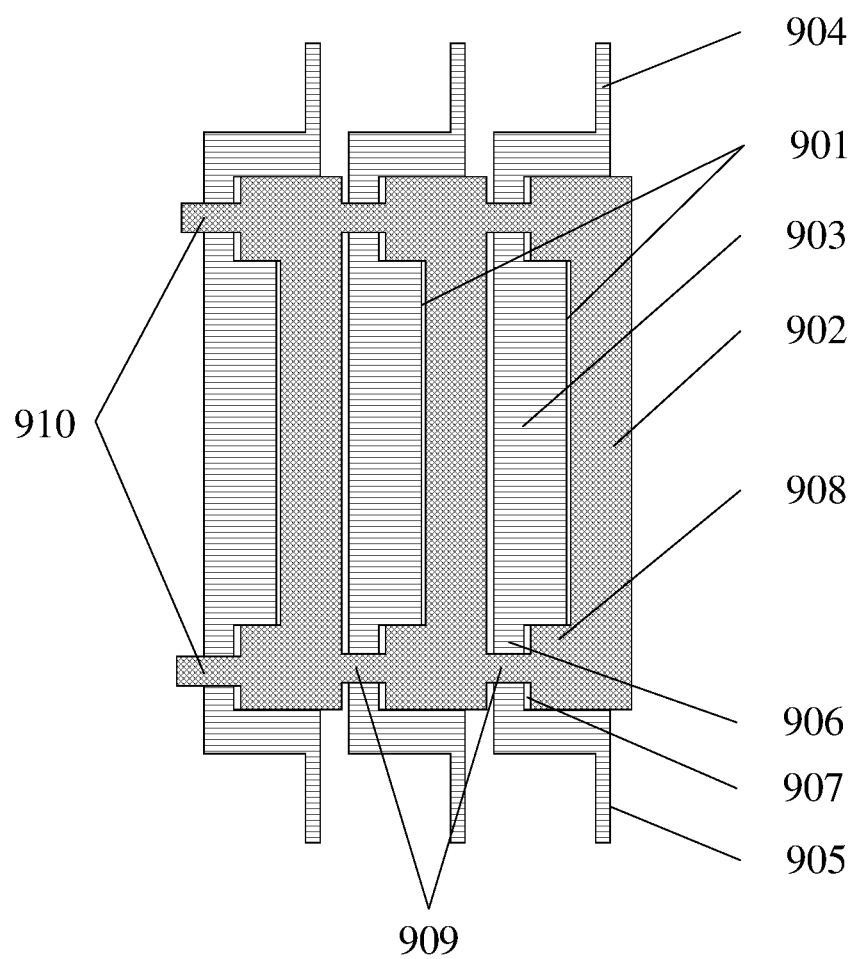
FIG. 9 is a second schematic diagram of a signal line structure in accordance with an embodiment of the disclosure.

As illustrated in FIG. 9, another signal line structure according to an embodiment of the disclosure includes: a plurality of signal lines 901 arranged adjacent to each other at the same layer, and redundant wires 902 each of which corresponds to two adjacent signal lines, where a positive projection of each redundant wire 902 onto the layer where the signal lines 901 are located covers a part or all of a gap between the two adjacent signal lines 901 corresponding to the redundant wire 902; and the signal line structure according to this embodiment further includes redundant connection lines 909 for connecting two adjacent redundant wires, and redundant wire input terminals 910 for grounding the redundant wires, or connecting the redundant wires with a stable signal source.

In the signal line structure as illustrated in FIG. 9, the width of a signal line body 903 of each signal line 901 ranges from 1 to 50 micrometers; the distance between two adjacent signal lines ranges from 1 to 50 micrometers; the signal lines 901 can be connected with a driver chip, or engaged with pads on the driver chip, or connected with a transmission line or a transmission terminal providing a signal, through signal line input terminals 904; the signal lines 901 can be connected with a display area or a function area, e.g., a gate driver circuit, a test circuit, etc., in which signals on the signal lines are received, through signal line output terminals 905; the width of each of the signal line input terminals 904 and the signal line output terminals 905 ranges from 1 to 50 micrometers, and may be the same as the width of the signal line bodies 903; the signal lines 901 can include signal line bent sections 906, where the width of the signal line bent sections 906 range from 1 to 50 micrometers, and is less than the width of the signal line bodies 903; the signal line bent sections 906 are formed with recessions 907; and the bodies 903, the signal line input terminals 904, and the signal line bent sections 906 of the signal lines 901 are formed in the same layer photolithograph process, and can be made of Cu, Al, Mo, Ti, Cr, W, Nd, Nb or another metal material, and/or an alloy of these metal materials.

In the signal line structure as illustrated in FIG. 9, the width of the redundant wires 902 ranges from 1 to 50 micrometers, where the redundant wires 902 are provided with redundant wire bent sections 908 corresponding to the signal line bent sections 906 so that the shape of the redundant wires 902 is the same as the shape as the gap between the signal lines 901; and the redundant wires 902 and the signal lines 901 are not formed in the same layer photolithograph process, and the redundant wires 902 and the signal lines 901 can be made of Cu, Al, Mo, Ti, Cr, W, Nd, Nb or another metal material, and/or an alloy of these metal materials.

In the signal line structure as illustrated in FIG. 9, the projection of each redundant wire 902 onto the layer where the signal lines 901 are located can completely cover the gap between two adjacent signal lines 901 in that the projection completely covers the gap between the signal lines 901 without overlapping with the signal lines 901 (that is, the projection of the redundant wire 902 onto the layer where the signal lines 901 are located overlaps with the signal lines 901 by a width of 0 micrometer), or the projection completely covers the gap between the signal lines 901 while overlapping with the signal lines 901 (for example, the projection of the redundant wire 902 onto the layer where the signal lines 901 are located overlaps with the signal lines 901 by a width of 0 micrometer, or more than 0 micrometer and less than 5 micrometers); or the projection of the redundant wire 902 onto the layer where the signal lines 901 are located can cover a part of the gap between the two adjacent signal lines 901 (for example, the distance between the projection of the redundant wire 902 onto the layer where the signal lines 901 are located, and the signal line 901 is more than 0 micrometer, and less than 5 micrometers).

In the signal line structure as illustrated in FIG. 9, the edges of the redundant wires 902 are substantially parallel to the edges of the signal lines 901, where the edges of the signal lines 901 and the redundant wires 902 will not be limited to the straight lines as illustrated in FIG. 9, but may be lines in any shape.

In the signal line structure as illustrated in FIG. 9, the plurality of redundant wires can be located at the same layer, every two adjacent redundant wires are connected through one of the redundant connection lines at the same layer as the redundant wires, and each redundant wire is not connected with any signal line, where the width of the redundant connection line ranges from 1 to 10 micrometers. Since projections of the redundant connection lines onto the layer where the signal lines are located overlap with the signal lines, the redundant connection line can be arranged at the redundant wire bent section corresponding to the signal line bent section to thereby reduce their overlapping area from which the parasitic capacitance may arise. As illustrated in FIG. 9, for example, a redundant connection line 909 connects redundant wire bent sections 908 of two adjacent redundant wires.

In the signal line structure as illustrated in FIG. 9, the redundant wires can be grounded, or connected with a stable signal source, through the redundant wire input terminals 910, where the width each of the redundant wire input terminals 910 ranges from 1 to 50 micrometers, and is less than the width of each of the redundant wires. The redundant wire input terminals 910 can be at the same layer as the redundant wires, or can be at a different layer from the redundant wires, and connected with the redundant wires through via-holes. The redundant wires in the signal line structure as illustrated in FIG. 9 can enable power lines originating from the signal lines to terminate at the redundant wires to thereby completely shield the crosstalk arising from the parasitic capacitance between the adjacent signal lines for the effect of stabilizing a transmitted signal.

Figure 10:
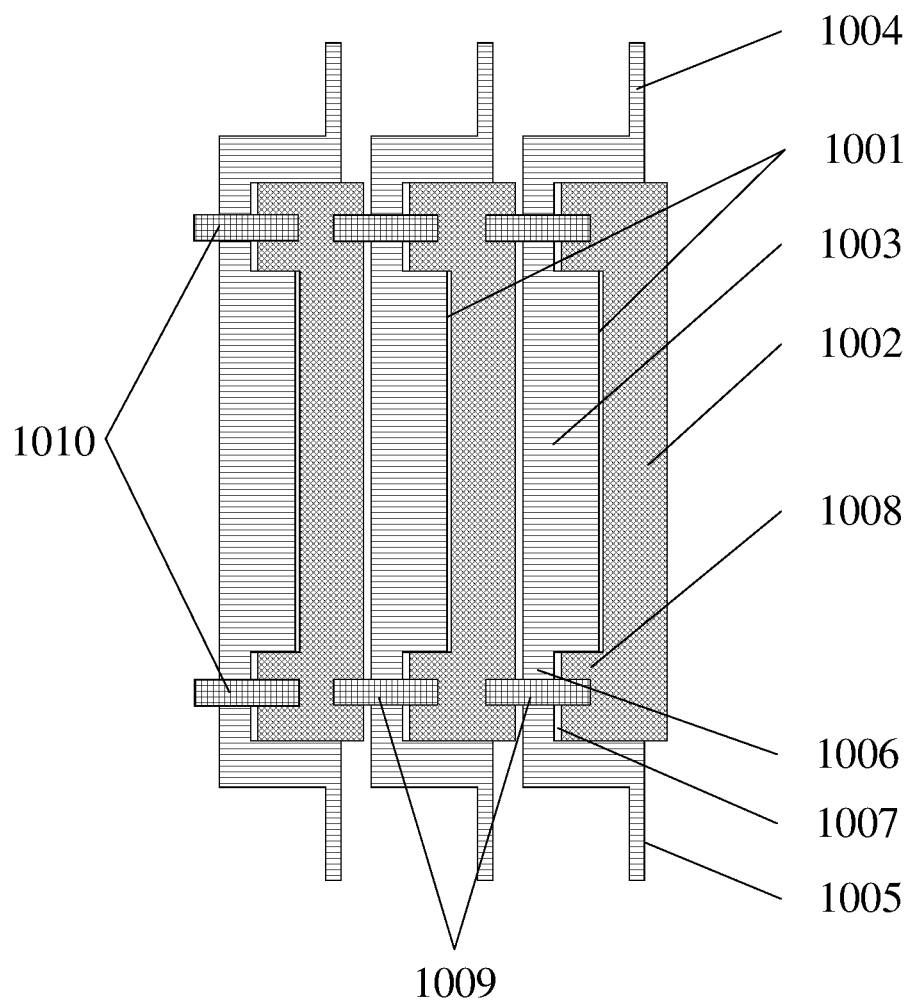
FIG. 10 is a third schematic diagram of a signal line structure in accordance with an embodiment of the disclosure.

As illustrated in FIG. 10, still another signal line structure according to an embodiment of the disclosure includes: a plurality of signal lines 1001 arranged adjacent to each other at the same layer, and redundant wires 1002 corresponding to two adjacent signal lines, where a positive projection of each redundant wire 1002 onto the layer where the signal lines 1001 are located covers a part or all of a gap between the two adjacent signal lines 1001 corresponding to the redundant wire 1002; and the signal line structure according to this embodiment further includes redundant connection lines 1009 for connecting two adjacent redundant wires, and redundant wire input terminals 1010 for grounding the redundant wires, or connecting the redundant wires with a stable signal source.

In the signal line structure as illustrated in FIG. 10, the width of a signal line body 1003 of each signal line 1001 ranges from 1 to 50 micrometers; the distance between two adjacent signal lines ranges from 1 to 50 micrometers; the signal lines 1001 can be connected with a driver chip, or engaged with pads on the driver chip, or connected with a transmission line or a transmission terminal providing a signal, through signal line input terminals 1004; the signal lines 1001 can be connected with a display area or a function area, e.g., a gate driver circuit, a test circuit, etc., in which signals on the signal lines are received, at signal line output terminals 1005; the widths of the signal line input terminals 1004 and the signal line output terminals 1005 range from 1 to 50 micrometers, and may be the same as the width of the signal line bodies 1003; the signal lines 1001 can include signal line bent sections 1006, where the width of the signal line bent sections 1006 range from 1 to 50 micrometers, and is less than the width of the signal line bodies 1003; the signal line bent sections 1006 are formed with recessions 1007; and the bodies 1003, the signal line input terminals 1004, and the signal line bent sections 1006 of the signal lines 1001 are formed in the same layer photolithograph process, and can be made of Cu, Al, Mo, Ti, Cr, W, Nd, Nb or another metal material, and/or an alloy of these metal materials.

In the signal line structure as illustrated in FIG. 10, the width of the redundant wires 1002 ranges from 1 to 50 micrometers, where the redundant wires 1002 are provided with redundant wire bent sections 1008 corresponding to the signal line bent sections 1006 so that the shape of the redundant wires 1002 is the same as the shape as the gap between the signal lines 1001; and the redundant wires 1002 and the signal lines 1001 are not formed in the same layer photolithograph process, and the redundant wires 1002 and the signal lines 1001 can be made of Cu, Al, Mo, Ti, Cr, W, Nd, Nb or another metal material, and/or an alloy of these metal materials.

In the signal line structure as illustrated in FIG. 10, the projection of each redundant wire 1002 onto the layer where the signal lines 1001 are located can completely cover the gap between two adjacent signal lines 1001 in that the projection completely covers the gap between the signal lines 1001 without overlapping with the signal lines 1001 (that is, the projection of the redundant wire 1002 onto the layer where the signal lines 1001 are located overlaps with the signal lines 1001 by a width of 0 micrometer), or the projection completely covers the gap between the signal lines 1001 while overlapping with the signal lines 1001 (for example, the projection of the redundant wire 1002 onto the layer where the signal lines 1001 are located overlaps with the signal lines 1001 by a width of 0 micrometer, or more than 0 micrometer and less than 5 micrometers); or the projection of the redundant wire 1002 onto the layer where the signal lines 1001 are located can cover a part of the gap between the two adjacent signal lines 1001 (for example, the distance between the projection of the redundant wire 1002 onto the layer where the signal lines 1001 are located, and the signal line 1001 is more than 0 micrometer, and less than 5 micrometers).

In the signal line structure as illustrated in FIG. 10, the edges of the redundant wires 1002 are substantially parallel to the edges of the signal lines 1001, where the edges of the signal lines 1001 and the redundant wires 1002 will not be limited to the straight lines as illustrated in FIG. 10, but may be lines in any shape.

In the signal line structure as illustrated in FIG. 10, the plurality of redundant wires can be located at the same layer, each redundant wire is not connected with any signal line, and every two adjacent redundant wires are connected through one of the redundant connection lines at a different layer as the redundant wires (that is, the redundant connection lines are not at the same layer as the signal lines), where the redundant connection lines are connected with the redundant wires through via-holes, and the width of the redundant connection lines ranges from 1 to 10 micrometers. Since projections of the redundant connection lines onto the layer where the signal lines are located overlap with the signal lines, the redundant connection lines can be arranged at the redundant wire bent sections corresponding to the signal line bent section to thereby reduce their overlapping area from which the parasitic capacitance may arise. As illustrated in FIG. 10, for example, a redundant connection line 1009 connects redundant wire bent sections 1008 of two adjacent redundant wires.

In the signal line structure as illustrated in FIG. 10, the redundant wires can be grounded, or connected with a stable signal source, through the redundant wire input terminals 1010, where the width of the redundant wire input terminals 1010 ranges from 1 to 50 micrometers, and is less than the width of the redundant wires. The redundant wire input terminals 1010 can be at the same layer as the redundant wires, or can be at a different layer from the redundant wires, and connected with the redundant wires through via-holes. The redundant wires in the signal line structure as illustrated in FIG. 10 can enable power lines originating from the signal lines to terminate at the redundant wires to thereby completely shield the crosstalk arising from the parasitic capacitance between the adjacent signal lines for the effect of stabilizing a transmitted signal.

Based upon the same idea of the disclosure, an embodiment of the disclosure further provides a signal line structure including the signal line structure according to any one of the embodiments above of the disclosure. Reference can be made to the embodiments above of the signal line structure for an implementation of the display device, so a repeated description thereof will be omitted here.

Based upon the same idea of the disclosure, an embodiment of the disclosure further provides a display device including the array substrate according to the embodiment above of the invention, where the display device can be a mobile phone, a tablet computer, a TV set, a display, a notebook computer, a digital photo frame, a navigator, or any other product or component capable of displaying. All the other components indispensable to the display device can be appreciated by those ordinarily skilled in the art, so a repeated description thereof will be omitted here, and the embodiments of the disclosure will not be limited thereto.

Reference can be made to the embodiments above of the signal line structure for an implementation of the display device, so a repeated description thereof will be omitted here.

Evidently those skilled in the art can make various modifications and variations to the invention without departing from the spirit and scope of the invention. Accordingly the invention is also intended to encompass these modifications and variations thereto so long as the modifications and variations come into the scope of the claims appended to the invention and their equivalents.

The invention claimed is:

1. A signal line structure, comprising:
   a plurality of signal lines arranged adjacent to each other at a same layer; and
   at least one redundant wire at a different layer from the signal lines, wherein each redundant wire corresponds to two adjacent signal lines, an extension direction of each redundant wire is the same as an extension direction of the two adjacent signal lines corresponding to the each redundant wire, and a positive projection of each redundant wire onto a layer where the signal lines are located covers a part or all of a gap between the two adjacent signal lines corresponding to the each redundant wire.

2. The signal line structure according to claim 1, wherein there are a plurality of redundant wires at a different layer from the signal lines, and all the redundant wires are arranged at a same layer.

3. The signal line structure according to claim 1, wherein when the signal lines are gate lines or leads of gate lines, the at least one redundant wire is arranged at a data line metal layer; and
   when the signal lines are data lines or leads of the data lines, the at least one redundant wire is arranged at a gate line metal layer.

4. The signal line structure according to claim 1, wherein a shape of each redundant wire is the same as a shape of the gap between the two adjacent signal lines corresponding to the each redundant wire.

5. The signal line structure according to claim 1, wherein a shape of each redundant wire is different from a shape of the gap between the two adjacent signal lines corresponding to the each redundant wire.

6. The signal line structure according to claim 1, wherein there are a plurality of redundant wires at a different layer from the signal lines, and the redundant wires are connected with the other redundant wires adjacent thereto at the same layer by redundant connection lines.

7. The signal line structure according to claim 6, wherein the redundant connection lines are at the same layer as the redundant wires.

8. The signal line structure according to claim 6, wherein when the redundant connection lines are at a different layer from the redundant wires, then the redundant connection lines are connected with the redundant wires through via-holes.

9. The signal line structure according to claim 1, wherein the at least one the redundant wire is floating.

10. The signal line structure according to claim 1, the at least one redundant wire is grounded by at least one redundant wire input terminal.

11. The signal line structure according to claim 1, the at least one redundant wire is connected with the same stable signal source by at least one redundant wire input terminal.

12. The signal line structure according to claim 11, wherein the stable signal source is a common voltage supply, or a stable signal in an array substrate.

13. The signal line structure according to claim 1, wherein the signal line structure further comprises: an insulation layer between the layer where signal lines are located and the layer where the at least one redundant wire is located.

14. The signal line structure according to claim 13, wherein the insulation layer comprises a part or all of a gate insulation layer, an interlayer insulation layer, a passivation layer, or a planarization layer.

15. The signal line structure according to claim 1, wherein the signal lines comprise a part or all of gate lines, leads of the gate lines, data lines, leads of the data lines, common electrode lines, leads of the common electrode lines, power source lines, leads of the power source lines, control signal lines, leads of the control signal lines, clock signal lines, or leads of the clock signal lines.

16. An array substrate, comprising a signal line structure, wherein the signal line structure comprises:
   a plurality of signal lines arranged adjacent to each other at a same layer;
   at least one redundant wire at a different layer from the signal lines, wherein each redundant wire corresponds to two adjacent signal lines, an extension direction of each redundant wire is the same as an extension direction of the two adjacent signal lines corresponding to the each redundant wire, and a positive projection of each redundant wire onto a layer where the signal lines are located covers a part or all of a gap between the two adjacent signal lines corresponding to the each redundant wire.

17. A display device, comprising an array substrate, wherein the array substrate comprises a signal line structure, and the signal line structure comprises:
   a plurality of signal lines arranged adjacent to each other at a same layer;
   at least one redundant wire at a different layer from the signal lines, wherein each redundant wire corresponds to two adjacent signal lines, an extension direction of each redundant wire is the same as an extension direction of the two adjacent signal lines corresponding to the each redundant wire, and a positive projection of each redundant wire onto a layer where the signal lines are located covers a part or all of a gap between the two adjacent signal lines corresponding to the each redundant wire.

\* \* \* \* \*